(12) United States Patent
Pan

(10) Patent No.: US 8,253,194 B2
(45) Date of Patent: Aug. 28, 2012

(54) STRUCTURES FOR REDUCING DOPANT OUT-DIFFUSION FROM IMPLANT REGIONS IN POWER DEVICES

(75) Inventor: James Pan, West Jordan, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 827 days.

(21) Appl. No.: 12/212,489

(22) Filed: Sep. 17, 2008

(65) Prior Publication Data

US 2010/0065905 A1 Mar. 18, 2010

(51) Int. Cl.
*H01L 29/66* (2006.01)
(52) U.S. Cl. .................. 257/332; 257/330; 257/E29.26
(58) Field of Classification Search .......... 257/330–334, 257/E29.257, E29.259, E29.26, E21.419; 438/270
See application file for complete search history.

(56) References Cited

U.S. PATENT DOCUMENTS

| | | | |
|---|---|---|---|
| 5,387,807 A * | 2/1995 | Bayraktaroglu | ............... 257/197 |
| 5,731,626 A | 3/1998 | Eaglesham et al. | |
| 6,590,271 B2 | 7/2003 | Liu et al. | |
| 7,170,083 B2 | 1/2007 | Freeman et al. | |
| 7,235,843 B2 | 6/2007 | Vanderpool et al. | |
| 2008/0169505 A1* | 7/2008 | Hsieh | ............................. 257/331 |
| 2008/0197407 A1 | 8/2008 | Challa et al. | |

* cited by examiner

*Primary Examiner* — Tucker Wright

(57) ABSTRACT

A semiconductor structure comprises a drift region of a first conductivity type in a semiconductor region. A well region of a second conductivity type is over the drift region. A source region of the first conductivity type is in an upper portion of the well region. A heavy body region of the second conductivity type extends in the well region. The heavy body region has a higher doping concentration than the well region. A first diffusion barrier region at least partially surrounds the heavy body region. A gate electrode is insulated from the semiconductor region by a gate dielectric.

14 Claims, 3 Drawing Sheets

STRUCTURES FOR REDUCING DOPANT OUT-DIFFUSION FROM IMPLANT REGIONS IN POWER DEVICES

BACKGROUND OF THE INVENTION

The present invention relates in general to semiconductor technology, and more particularly, to structures and methods for reducing dopant out-diffusion from implant regions, such as source and heavy body regions, in power field effect transistors (FETs).

In the design of FETs it is desirable to have a heavily doped body region that extends below the source region. This heavy body region provides a low resistance path around the source area to keep the well-source junction from becoming forward biased, thus preventing a parasitic bipolar transistor inherently present in power FETs from turning on. The ability of the transistor to avoid turning on this parasitic bipolar transistor is commonly referred to as ruggedness. A deep heavy body region also helps move the electric field and its breakdown current path away from the gate dielectric. Moving the electric field away from the gate dielectric reduces the possibility of damage by hot electrons.

Some technologies improve transistor ruggedness and gate dielectric integrity by forming a heavy body region using a high energy implant followed by a temperature cycle to drive the heavy body dopants to the desired depth. The temperature cycle that drives in the dopants, however, as well as other temperature cycles during the manufacturing process, cause lateral diffusion of the heavy body and source dopants. Laterally diffused heavy body and/or source dopants may interfere with the active channel area and alter transistor threshold voltage. Also, laterally diffused source dopants may increase the heavy body contact resistance. To avoid these effects, limits are placed on minimum cell pitch. However, a larger cell pitch reduces device density and increases drain-to-source on resistance ($R_{DSon}$), which adversely affects transistor performance.

Thus, there is a need for structures and methods for reducing dopant out-diffusion from heavy body and source regions in power FETs.

BRIEF SUMMARY OF THE INVENTION

In accordance with an embodiment of the invention, a semiconductor structure comprises a drift region of a first conductivity type in a semiconductor region. A well region of a second conductivity type is over the drift region. A source region of the first conductivity type is in an upper portion of the well region. A heavy body region of the second conductivity type extends in the well region. The heavy body region has a higher doping concentration than the well region. A first diffusion barrier region at least partially surrounds the heavy body region. A gate electrode is insulated from the semiconductor region by a gate dielectric.

In one embodiment, the first diffusion barrier region comprises carbon.

In another embodiment, the first diffusion barrier region extends along the sides and bottom of the heavy body region.

In another embodiment, the first diffusion barrier region is configured to minimize lateral diffusion of dopants from the heavy body region.

In yet another embodiment, a second diffusion barrier region extends between the source region and the well region.

In accordance with another embodiment of the invention, a semiconductor structure is formed as follows. A well region of a first conductivity type is formed in a semiconductor region. A source region of the second conductivity type is formed in an upper portion of the well region. A heavy body region of the first conductivity type is formed in the well region. The heavy body region has a higher doping concentration than the well region. A first diffusion barrier region is formed in the well region. The first diffusion barrier layer at least partially surrounds the heavy body region. A gate electrode and a gate dielectric are formed. The gate dielectric extends between the gate electrode and the semiconductor region.

In one embodiment, the first diffusion barrier region at least partially overlaps the heavy body region.

In another embodiment, a second diffusion barrier region is formed extending between the source region and the well region.

In yet another embodiment, the first diffusion barrier region and the second diffusion barrier region comprise carbon.

The following detailed description and the accompanying drawings provide a better understanding of the nature and advantages of the present invention.

DETAILED DESCRIPTION OF THE INVENTION

In accordance with embodiments of the present invention, FET structures with reduced out-diffusion from the heavy body and/or source regions are obtained using simple manufacturing processes. Some embodiments include FET structures with a diffusion barrier layer surrounding the heavy body region. Other embodiments include FET structures with a diffusion barrier layer extending between the source region and the well region. Each of these embodiments reduces out-diffusion of the heavy body and/or source dopants. These and other embodiments of the invention, as well as other features and advantages, are described in more detail below.

Figure 1:
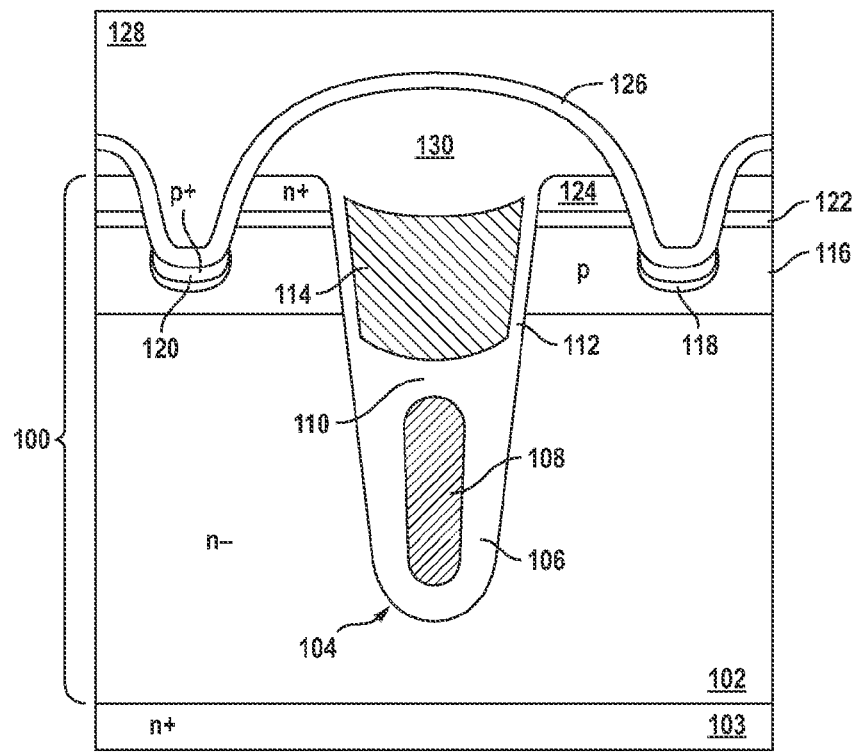
FIG. 1 shows a simplified cross-section view of a shielded gate trench FET structure with diffusion barrier regions, in accordance with an embodiment of the invention.

FIG. 1 shows a simplified cross-section view of a shielded gate trench FET structure with diffusion barrier regions, in accordance with an embodiment of the invention. As shown in FIG. 1, semiconductor region 100 includes source diffusion barrier regions 122 extending between n+ type source regions 124 and p-type well regions 116. Source diffusion barrier regions 122 inhibit out-diffusion of source dopants. Heavy body regions 120 are formed in well regions 116 and are at least partially surrounded by heavy body diffusion barrier regions 118. Heavy body diffusion barrier regions 118 inhibit out-diffusion of heavy body dopants.

Also shown in FIG. 1 is trench 104 extending from the top surface of semiconductor region 100 into drift region 102. In one embodiment, trench 104 extends deeper terminating in n+ substrate 103. Shield electrode 108 is in a bottom portion of trench 104 and is surrounded on its sides and bottom by shield dielectric 106. Gate electrode 114 is in an upper portion of trench 104 and is surrounded on the sides by gate dielectric 112. Inter-electrode dielectric (IED) 110 extends between shield electrode 108 and gate electrode 114.

Also shown in FIG. 1 is barrier layer 126 (e.g., comprising metal) extending over semiconductor region 100. Gate electrode 114 is isolated from barrier layer 126 by dielectric 130. Interconnect layer 128 (e.g., comprising metal) extends over barrier layer 126 and forms the source electrode. Another interconnect layer (not shown) extends along the bottom surface of semiconductor region 100 and forms the drain electrode.

Figure 2A:
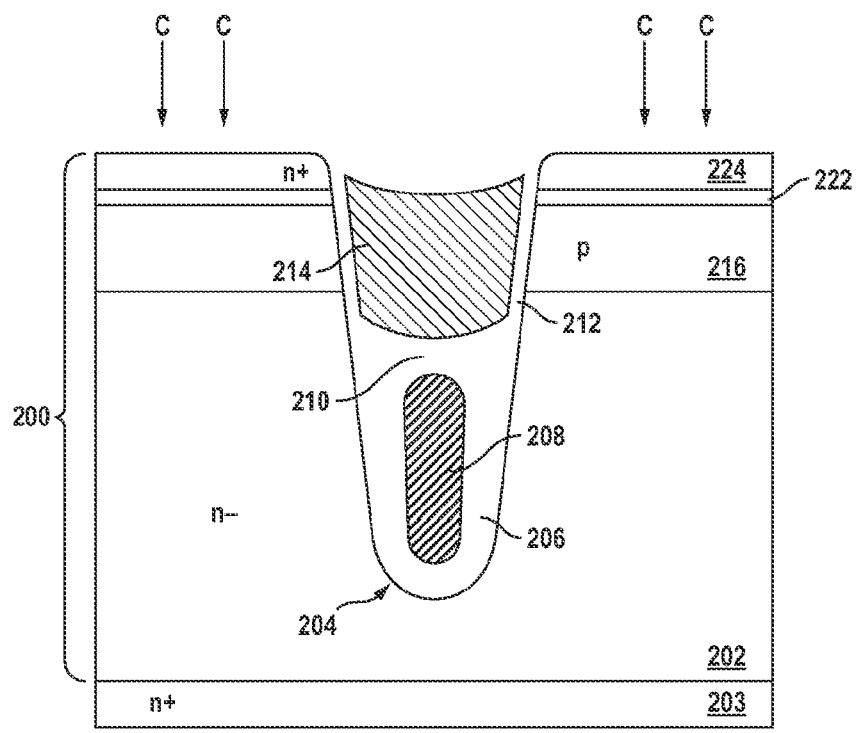
FIGS. 2A-2C show simplified cross-section views at various steps of a process for forming a shielded gate trench FET structure with diffusion barrier regions, in accordance with an embodiment of the invention.
Figure 2B:
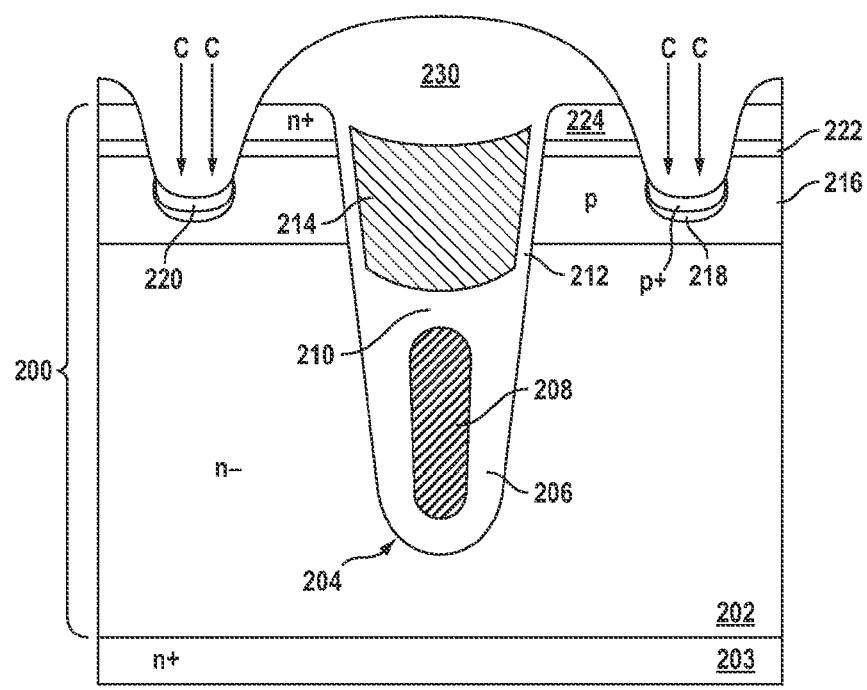
Figure 2C:
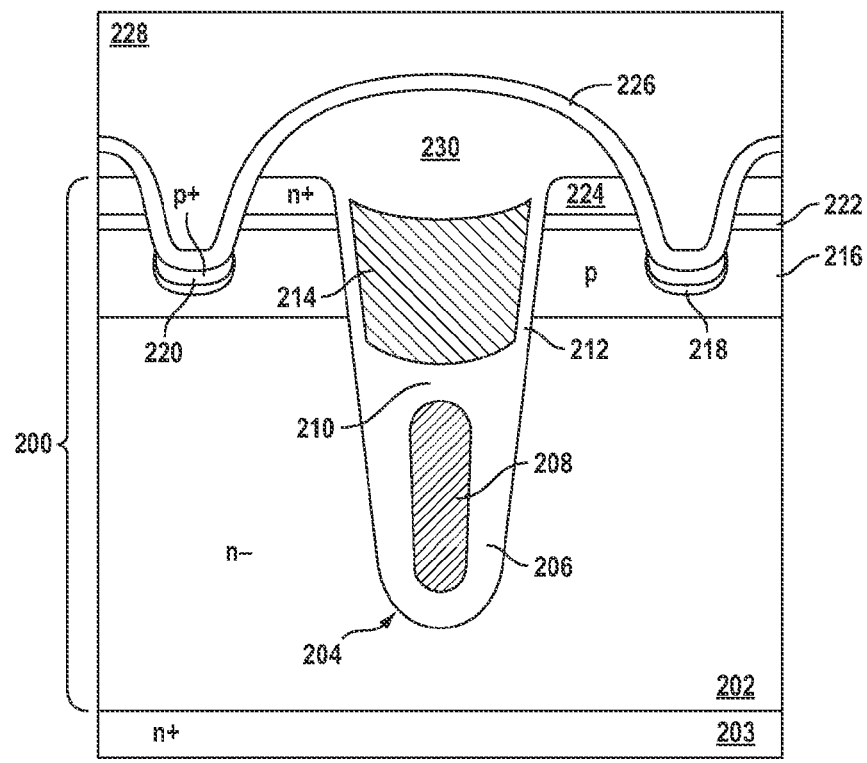

FIGS. 2A-2C show simplified cross-section views at various steps of a process for forming a shielded gate trench FET structure with diffusion barrier regions, in accordance with an embodiment of the invention. The diffusion barrier regions may be used to prevent out-diffusion of dopants from the heavy body and source regions.

In FIG. 2A, trench 204 is formed in semiconductor region 200 using conventional photolithography and etch techniques. Semiconductor region 200 includes n-type drift region 202. In one embodiment, semiconductor region 200 is an epitaxial layer extending over highly doped n+ type substrate 203. In one embodiment, the portion of the epitaxial layer bounded by substrate 203 and well region 216 forms what is commonly referred to as the drift region. In some embodiments, trench 204 may extend into and terminate within the drift region. In other embodiments, trench 204 may extend through the epitaxial layer and terminate within substrate 203.

Shield dielectric 206, shield electrode 208, IED 210, gate dielectric 212, and gate electrode 214 are formed in trench 204 using known techniques. For example, formation of shield dielectric 206 and shield electrode 208 may include forming a dielectric layer along the sidewalls and bottom of trench 204 using a conventional deposition or thermal oxidation process. A layer of polysilicon may be formed over the dielectric layer using a conventional polysilicon deposition process. The dielectric and polysilicon layers may be etched using known techniques to recess the layers and form shield dielectric 206 and shield electrode 208 in the bottom portion of trench 204. The formation of IED 210 may include forming a dielectric layer over shield electrode 208 using a conventional dielectric deposition process. One or more conventional dry or wet etch processes may be used to recess the dielectric and form IED 210. Gate dielectric 212 may be formed along the upper trench sidewalls and over the mesa regions using a conventional deposition or thermal oxidation process. The formation of gate electrode 214 may include forming a polysilicon layer over gate dielectric 212 using a conventional polysilicon deposition process. One or more conventional polysilicon etch or chemical mechanical polishing (CMP) processes may be used to remove the polysilicon from over the mesa regions and form gate electrode 214.

Source regions 224 and well regions 216 are formed in an upper portion of semiconductor region 200 using conventional implant and diffusion processes. For example, a conventional source implant process may be used to implant n-type dopants into an upper portion of semiconductor region 200, and a conventional well implant process may be used to implant p-type dopants into an upper portion of semiconductor region 200. One or more conventional diffusion processes may be used to activate the dopants and form source regions 224 and well regions 216 adjacent to trench 204. In some embodiments, one or both of these regions may be formed prior to formation of trench 204.

Source diffusion barrier regions 222 may be formed between source regions 224 and well regions 216 using known techniques. For example, in one embodiment source diffusion barrier regions 222 may be formed using a conventional implant process to implant carbon atoms into semiconductor region 200 at a dose of between about $1 \times 10^{14}$-$5 \times 10^{15}$ atoms/cm$^2$ and an energy of about 200 keV or less. The carbon atoms are mostly neutral and have little effect on the resistivity of the surrounding regions. The dose and energy of the carbon implant can be carefully designed to form source diffusion barrier regions 222 that inhibit out-diffusion of source dopant atoms. In accordance with embodiments of the invention, source diffusion barrier regions 222 may be formed in a lower portion of source regions 224, in an upper portion of well regions 216, or between source regions 224 and well regions 216. In some embodiments, source diffusion barrier regions 222 may be formed prior to formation of source regions 224 and/or well regions 216.

In FIG. 2B, dielectric 230, heavy body regions 220, and heavy body diffusion barrier regions 218 are formed using known techniques. For example, in one embodiment a dielectric layer (e.g., BPSG) may be formed over the structure using a conventional chemical vapor deposition (CVD) process and patterned using conventional photolithography and etch processes. The remaining portion of the dielectric layer covering gate electrode 214 may be reflowed by exposure to a conventional thermal process to form dome-shaped dielectric 230. In some embodiments, a conventional self-aligned etch process may be used to form recesses in semiconductor region 200 along the sides of dielectric 230.

Heavy body regions 220 may be formed using conventional implant processes. For example, in one embodiment a conventional heavy body implant process may be used to implant p-type dopants into semiconductor region 200. The heavy body implant may be self-aligned in that the dopants are implanted into semiconductor region 200 through openings along the sides of dielectric 230. If recesses are formed along the sides of dielectric 230, heavy body regions 220 may be formed along the bottom of the recesses. If recesses are not formed along the sides of dielectric 230, heavy body regions 220 may be formed extending from the top surface of semiconductor region 200 into well regions 216. In some embodiments, the heavy body implant may be a blanket implant in the active area. In other embodiments, a mask may be used to form periodic heavy body regions.

Heavy body diffusion barrier regions 218 may be formed surrounding heavy body regions 220 using known techniques. For example, in one embodiment heavy body diffusion barrier regions 218 may be formed using a conventional implant process to implant carbon atoms into semiconductor region 200 at a dose of between about $1 \times 10^{14}$-$5 \times 10^{15}$ atoms/cm$^2$ and an energy of about 100 keV or less. The dose and energy of the carbon implant can be carefully designed to form heavy body diffusion barrier regions 218 that inhibit out-diffusion of heavy body dopant atoms. In accordance with embodiments of the invention, heavy body diffusion barrier regions 218 may be formed in a lower portion of heavy body regions 220 or under heavy body regions 220. In some embodiments, heavy body diffusion barrier regions 218 may be formed prior to formation of heavy body regions 220.

Heavy body diffusion barrier regions 218 allow the heavy body contact resistance to be reduced by increasing heavy body dopant concentration. The heavy body dopant concentration can be increased by inhibiting out-diffusion of heavy body dopants or by increasing the heavy body dopant concentration. As an example, heavy body diffusion barrier regions in accordance with embodiments of the invention allow a conventional heavy body implant of boron at a dose of between about $1 \times 10^{14}$-$1 \times 10^{15}$ atoms/cm$^2$ to be increased to between about $2 \times 10^{15}$-$8 \times 10^{15}$ atoms/cm$^2$ without affecting threshold voltage.

In FIG. 2C, barrier layer 226 and interconnect layer 228 are formed over the structure using known techniques. For example, in one embodiment barrier layer 226 is formed using a conventional metal deposition process. Barrier layer 226 contacts heavy body regions 220 along the sides of dielectric 230. Interconnect layer 228 may be formed over barrier layer 226 using a conventional metal deposition process.

Structures formed according to embodiments of the present invention enjoy, among other advantages and features, improved threshold voltage stability (by inhibiting heavy body and/or source dopant diffusion to the channel area) and lower contact resistance (by inhibiting source dopant diffusion to the heavy body contact area, by reducing dopant out-diffusion from the heavy body region, and/or by allowing increased doping of the heavy body region). Further, embodiments of the invention described herein are advantageously simple to implement thus enabling them to be easily integrated with conventional processes for forming other FET structures. Two such structures are the trench-gate FET and the vertically conducting planar gate FET shown respectively in FIGS. 3 and 4.

Figure 3:
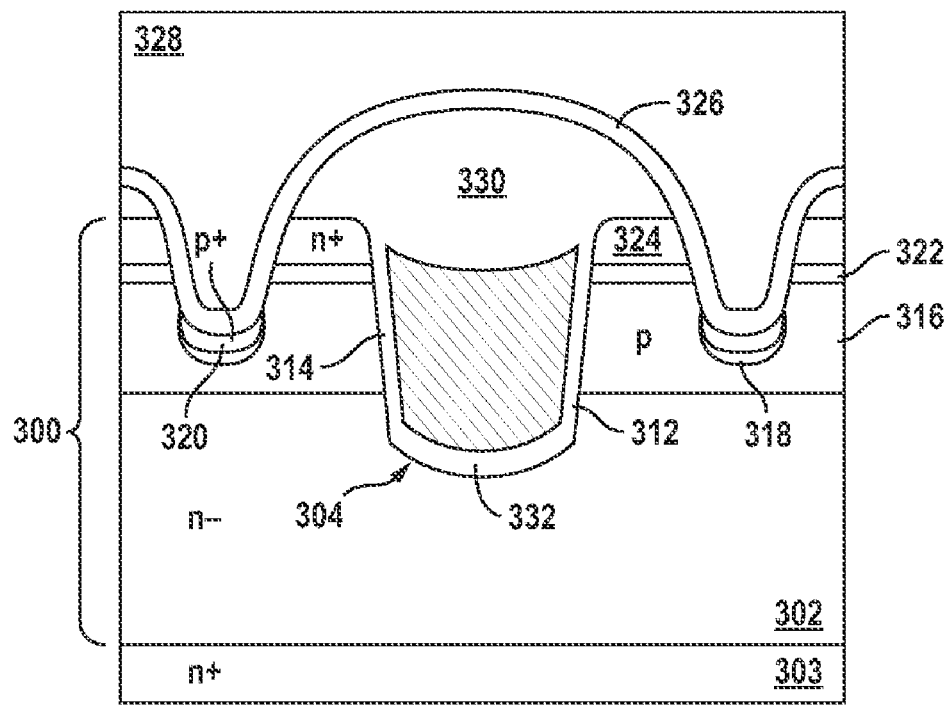
FIG. 3 shows a simplified cross-section view of a trench-gate FET structure with diffusion barrier regions, in accordance with an embodiment of the invention.

FIG. 3 shows a simplified cross-section view of a trench-gate FET structure with diffusion barrier regions, in accordance with an embodiment of the invention. The trench-gate FET structure shown in FIG. 3 may be formed in a manner similar to that described above with regard to FIGS. 2A-2C. For example, trench 304 may be formed in semiconductor region 300 in a manner similar to that described above with regard to FIG. 2A except that trench 304 may not extend as deep as trench 204 in FIG. 2A. In some embodiments, thick bottom dielectric (TBD) 332 may be formed along the bottom of trench 304 to reduce gate-drain capacitance. Any one of a number of known process techniques for forming the TBD may be used. For example, one may use the process steps described in the commonly assigned patent application Ser. No. 12/143,510, titled "Structure and Method for Forming a Thick Bottom Dielectric (TBD) for Trench-Gate Devices," filed Jun. 20, 2008, which is incorporated herein by reference in its entirety.

Gate dielectric 312, gate electrode 314, source regions 324, well regions 316, and source diffusion barrier regions 322 may be formed in a manner similar to that described above with regard to FIG. 2A. Dielectric 330, heavy body regions 320, and heavy body diffusion barrier regions 318 may be formed in a manner similar to that described above with regard to FIG. 2B. Barrier layer 326 and interconnect layer 328 may be formed in a manner similar to that described above with regard to FIG. 2C.

In one embodiment, source diffusion barrier regions 322 may comprise carbon and extend between source regions 324 and well regions 316. In some embodiments, heavy body diffusion barrier regions 318 may comprise carbon and surround heavy body regions 320. The dose and energy of the carbon implants can be carefully designed to form source diffusion barrier regions 322 and heavy body diffusion barrier regions 318 that inhibit out-diffusion of source and heavy body dopants.

Figure 4:
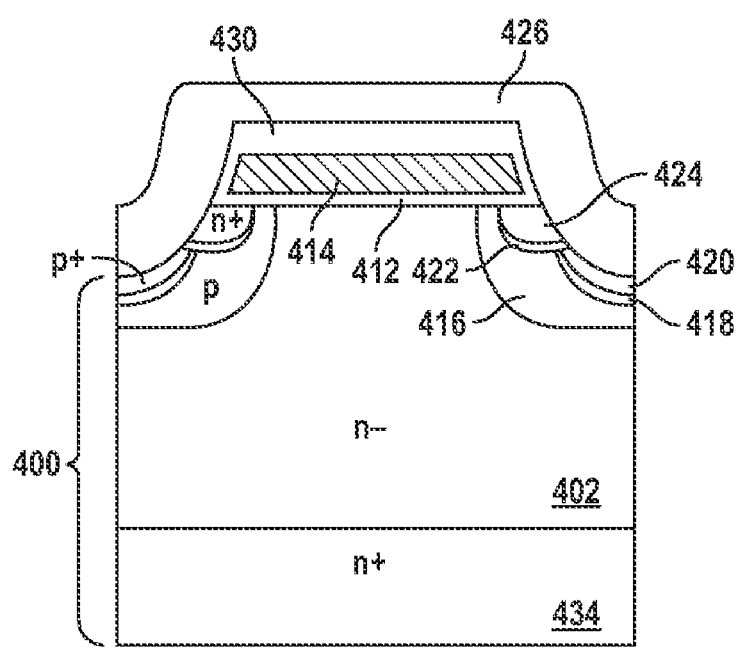
FIG. 4 shows a simplified cross-section view of a vertically conducting planar gate FET structure with diffusion barrier regions, in accordance with an embodiment of the invention.

FIG. 4 shows a simplified cross-section view of a vertically conducting planar gate FET structure with diffusion barrier regions, in accordance with an embodiment of the invention. As shown in FIG. 4, semiconductor region 400 includes an n-type drift region 402 extending over a highly doped n+ type substrate 434. Semiconductor region 400 also includes source diffusion barrier regions 422 extending between source regions 424 and well regions 416. Semiconductor region 400 also includes heavy body diffusion barrier regions 418 surrounding heavy body regions 420. Source diffusion barrier regions 422 and heavy body diffusion barrier regions 418 inhibit out-diffusion of source and heavy body dopants.

Also shown in FIG. 4 is gate electrode 414 extending over semiconductor region 400 and overlapping source regions 424 and well regions 416 along the surface of semiconductor region 400. Gate dielectric 412 extends between gate electrode 414 and the upper surface of semiconductor region 400. Gate electrode 414 is isolated from barrier layer 426 by dielectric 430. An interconnect layer (not shown) extends over barrier layer 426 and forms the source electrode. Another interconnect layer (not shown) extends along the bottom surface of semiconductor region 400 and forms the drain electrode.

The structure illustrated in FIG. 4 may be formed according to known techniques. For example, formation of gate dielectric 412 and gate electrode 414 may include forming a dielectric layer along the surface of semiconductor region 400 using a conventional deposition or thermal oxidation process. A layer of polysilicon may be formed over the dielectric layer using a conventional polysilicon deposition process. The dielectric and polysilicon layers may be etched using conventional photolithography and etch processes to form gate dielectric 412 and gate electrode 414. Dielectric 430 may be formed over gate electrode 414 using a conventional CVD process. In some embodiments, recesses are formed along the sides of dielectric 430. Source regions 424, source diffusion barrier regions 422, heavy body regions 420, and heavy body diffusion barrier regions 418 may be formed using conventional implant processes. Barrier layer 426 may be formed over the structure using a conventional metal deposition process.

In one embodiment, source diffusion barrier regions 422 may comprise carbon and extend between source regions 424 and well regions 416. Heavy body diffusion barrier regions 418 may comprise carbon and surround heavy body regions 420. The dose and energy of the carbon implants can be carefully designed to form source diffusion barrier regions 422 and heavy body diffusion barrier regions 418 that inhibit out-diffusion of source and heavy body dopants.

Although FIGS. 1, 2B-2C, 3, and 4 show FET structures with source diffusion barrier regions 122, 222, 322, 422 and heavy body diffusion barrier regions 118, 218, 318, 418, some embodiments of the present invention may include only source diffusion barrier regions 122, 222, 322, 422, while other embodiments may include only heavy body diffusion barrier regions 118, 218, 318, 418.

Note that while the embodiments depicted in FIGS. 1, 2C, 3, and 4 shows n-channel FETs, p-channel FETs may be obtained by reversing the polarity of the source regions, well regions, drift regions, and substrate. Further, in embodiments where the semiconductor regions include an epitaxial layer extending over a substrate, MOSFETs are obtained where the substrate and epitaxial layer are of the same conductivity type, and IGBTs are obtained where the substrate has the opposite conductivity type to that of the epitaxial layer.

It should be understood that the above description is exemplary only, and the scope of the invention is not limited to these specific examples. The dimensions in the figures of this application are not to scale, and at times the relative dimensions are exaggerated or reduced in size to more clearly show various structural features. Additionally, while only one transistor is shown in each figure, it is to be understood that the structure illustrated may be replicated many times in an actual device.

Furthermore, it should be understood that the doping concentrations of the various elements could be altered without departing from the invention. Also, while the various embodiments described above are implemented in conventional silicon, these embodiments and their obvious variants can also be implemented in silicon carbide, gallium arsenide, gallium nitride, diamond, or other semiconductor materials. Additionally, the features of one or more embodiments of the invention may be combined with one or more features of other embodiments of the invention without departing from the scope of the invention.

Therefore, the scope of the present invention should be determined not with reference to the above description, but should instead be determined with reference to the appended claims, along with their full scope of equivalents.

What is claimed is:

1. A semiconductor structure comprising:
   a drift region of a first conductivity type in a semiconductor region;
   a well region of a second conductivity type over the drift region;
   a source region of the first conductivity type in an upper portion of the well region;
   a heavy body region of the second conductivity type extending in the well region, the heavy body region having a higher doping concentration than the well region;
   a first diffusion barrier region comprising carbon surrounding sides and bottom of the heavy body region, wherein portions of the first diffusion barrier region surrounding the sides of the heavy body region have a first thickness measured along a first line extending laterally between the heavy body region and the well region, and a portion of the first diffusion barrier region surrounding the bottom of the heavy body region has a second thickness measured along a second line extending vertically between the bottom of the heavy body region and the well region, the first line being substantially perpendicular to the second line and the second thickness being greater than the first thickness; and
   a gate electrode insulated from the semiconductor region by a gate dielectric.

2. The semiconductor structure of claim 1 further comprising:
   a trench extending into the semiconductor region, wherein the gate electrode is in the trench and the gate dielectric extends along sidewalls and a bottom of the trench, and wherein the well region and the source region abut the sidewalls of the trench.

3. The semiconductor structure of claim 1 wherein the gate electrode is positioned over an upper surface of the semiconductor region and the gate dielectric extends between the gate electrode and the upper surface of the semiconductor region, and wherein the gate electrode overlaps the source region and the well region along a surface of the semiconductor region.

4. The semiconductor structure of claim 1 wherein the first diffusion barrier region at least partially overlaps the heavy body region.

5. The semiconductor structure of claim 1 wherein the first diffusion barrier region is configured to minimize lateral diffusion of dopants from the heavy body region.

6. The semiconductor structure of claim 1 further comprising:
   a second diffusion barrier region extending between the source region and the well region.

7. The semiconductor structure of claim 6 wherein the second diffusion barrier region comprises carbon.

8. The semiconductor structure of claim 6 wherein the second diffusion barrier region is configured to minimize out-diffusion of dopants from the source region.

9. A semiconductor structure comprising:
   a drift region of a first conductivity type in an epitaxial layer;
   a well region of a second conductivity type in the epitaxial layer, the well region extending over the drift region;
   a source region of the first conductivity type in the epitaxial layer, the source region disposed in an upper portion of the well region;
   a first diffusion barrier region extending between the source region and the well region in the epitaxial layer;
   a heavy body region of the second conductivity type extending in the well region, the heavy body region having a higher doping concentration than the well region;
   a second diffusion barrier region surrounding sides and bottom of the heavy body region, wherein portions of the second diffusion barrier region surrounding the sides of the heavy body region have a first thickness measured along a first line extending laterally between the heavy body region and the well region, and a portion of the second diffusion barrier region surrounding the bottom of the heavy body region has a second thickness measured along a second line extending vertically between the bottom of the heavy body region and the well region, the first line being substantially perpendicular to the second line and the second thickness being greater than the first thickness; and
   a gate electrode insulated from the epitaxial layer by a gate dielectric.

10. The semiconductor structure of claim 9 wherein the first diffusion barrier region comprises carbon.

11. The semiconductor structure of claim 9 further comprising:
    a trench extending into the epitaxial layer, wherein the gate electrode is in the trench and the gate dielectric extends along sidewalls and a bottom of the trench, and wherein the well region and the source region are adjacent to the sidewalls of the trench.

12. The semiconductor structure of claim 9 wherein the gate electrode is positioned over an upper surface of the epitaxial layer and the gate dielectric extends between the gate electrode and the upper surface of the semiconductor region, and wherein the gate electrode overlaps the source region and the well region along a surface of the epitaxial layer.

13. The semiconductor structure of claim 9 wherein the first diffusion barrier region at least partially overlaps the source region.

14. The semiconductor structure of claim 9 wherein the first diffusion barrier region is configured to minimize down-diffusion of dopants from the source region.

* * * * *